(12) United States Patent
Karve et al.

(10) Patent No.: US 10,304,689 B2
(45) Date of Patent: *May 28, 2019

(54) MARGIN FOR FIN CUT USING SELF-ALIGNED TRIPLE PATTERNING

(71) Applicant: International Business Machines Corporation, Armonk, NY (US)

(72) Inventors: Gauri Karve, Cohoes, NY (US); Fee Li Lie, Albany, NY (US); Eric R. Miller, Schenectady, NY (US); Stuart A. Sieg, Albany, NY (US); John R. Sporre, Albany, NY (US); Sean Teehan, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/939,677

(22) Filed: Mar. 29, 2018

(65) Prior Publication Data
US 2018/0226262 A1 Aug. 9, 2018

Related U.S. Application Data

(63) Continuation of application No. 15/277,431, filed on Sep. 27, 2016, now Pat. No. 9,997,369.

(51) Int. Cl.
*H01L 21/308* (2006.01)
*H01L 21/311* (2006.01)
*H01L 21/033* (2006.01)

(52) U.S. Cl.
CPC ...... *H01L 21/3086* (2013.01); *H01L 21/0337* (2013.01)

(58) Field of Classification Search
CPC ............ H01L 21/3086; H01L 21/3081; H01L 21/0332; H01L 21/0337; H01L 21/32139;
(Continued)

(56) References Cited

U.S. PATENT DOCUMENTS 8,237,136 B2  8/2012  Hautala et al.
8,263,446 B2  9/2012  Cheng et al.
(Continued)

OTHER PUBLICATIONS

List of IBM Patents or Patent Applications Treated As Related.

*Primary Examiner* — Andrew Q Tran
(74) *Attorney, Agent, or Firm* — Fleit Gibbons Gutman Bongini Bianco PL; Thomas S. Grzesik (57) ABSTRACT

A method for fabricating a semiconductor structure includes forming a plurality of mandrel structures. A plurality of first spacers is formed on sidewalls of the mandrel structures. A plurality of second spacers is formed on sidewalls of the first spacers. The plurality of first spacers is removed selective to the plurality of second spacers and mandrel structures. A cut mask is formed over a first set of second spacers of the plurality of second spacers and a first set of mandrel structures of the plurality of mandrel structures. A second set of second spacers of the plurality of spacers and a second set of mandrel structures of the plurality of mandrel structures remain exposed. One of the second set of mandrel structures and the second set of second spacers is removed selective to the second set of second spacers and the second set of mandrel structures, respectively.

20 Claims, 10 Drawing Sheets

(58) Field of Classification Search
CPC ......... H01L 21/823431; H01L 29/7855; H01L 29/785; H01L 29/7858; H01L 29/66795
See application file for complete search history.

(56) References Cited

U.S. PATENT DOCUMENTS

| | | | |
|---|---|---|---|
| 8,354,331 B2 | 1/2013 | Cheng et al. | |
| 8,557,704 B2 | 10/2013 | Wells et al. | |
| 8,932,957 B2 | 1/2015 | Shieh et al. | |
| 9,123,776 B2 | 9/2015 | Tsai et al. | |
| 9,171,764 B2 | 10/2015 | Kim et al. | |
| 9,209,038 B2 | 12/2015 | Cantone et al. | |
| 9,269,590 B2 | 2/2016 | Luere et al. | |
| 9,305,845 B2 | 4/2016 | Colburn et al. | |
| 9,431,265 B2 | 8/2016 | Cheng et al. | |
| 9,997,369 B2 * | 6/2018 | Karve | H01L 21/3081 |
| 2015/0287612 A1 | 10/2015 | Luere et al. | |
| 2016/0071771 A1 | 3/2016 | Colburn et al. | |
| 2016/0093502 A1 | 3/2016 | Cheng et al. | |
| 2016/0111297 A1 | 4/2016 | Chen et al. | |
| 2016/0163600 A1 | 6/2016 | Colburn et al. | |

* cited by examiner

MARGIN FOR FIN CUT USING SELF-ALIGNED TRIPLE PATTERNING

BACKGROUND OF THE INVENTION

The present invention generally relates to the field of semiconductors, and more particularly relates to forming semiconductor fins using mandrels and spacers having different etching characteristics.

As integrated circuits continue to scale downward in size, fin field effect transistors (finFETs) are becoming increasingly attractive to be used in smaller nodes, e.g., the 22 nm node and beyond. One problem that is associated with forming semiconductor fins at tight pitch is that the process window for cutting of unwanted semiconductor fins is quite narrow. More specifically, the space available between fins at a tight pitch decreases the process window for placement of a fin cut mask edge in between fins. As the pitch of the semiconductor fins decreases, it becomes difficult to remove unwanted semiconductor fins without adversely affecting adjacent device fins due to the process variation and small process margin of lithographic processes.

SUMMARY OF THE INVENTION

In one embodiment, a method for forming a semiconductor structure is provided. The method includes forming a plurality of mandrel structures. A plurality of first spacers is formed on sidewalls of the plurality of mandrel structures. A plurality of second spacers is formed on sidewalls of the plurality of first spacers. The plurality of first spacers is removed selective to the plurality of second spacers and the plurality of mandrel structures. A cut mask is formed over a first set of second spacers in the plurality of second spacers and a first set of mandrel structures in the plurality of mandrel structures. A second set of second spacers in the plurality of spacers and a second set of mandrel structures in the plurality of mandrel structures remain exposed. The second set of mandrel structures is removed selective to the second set of second spacers.

In another embodiment, a method for forming a semiconductor structure is provided. The method includes forming a plurality of mandrel structures. A plurality of first spacers is formed on sidewalls of the plurality of mandrel structures. A plurality of second spacers is formed on sidewalls of the plurality of first spacers. The plurality of first spacers is removed selective to the plurality of second spacers and the plurality of mandrel structures. A cut mask is formed over a first set of second spacers in the plurality of second spacers and a first set of mandrel structures in the plurality of mandrel structures. A second set of second spacers in the plurality of spacers and a second set of mandrel structures in the plurality of mandrel structures remain exposed. The second set of second spacers is removed selective to the second set of mandrel structures.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

One or more embodiments include a design for an integrated circuit chip, which is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer is able to transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein are utilized in the fabrication of integrated circuit chips. The resulting integrated circuit chips are distributable by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Figure 1:
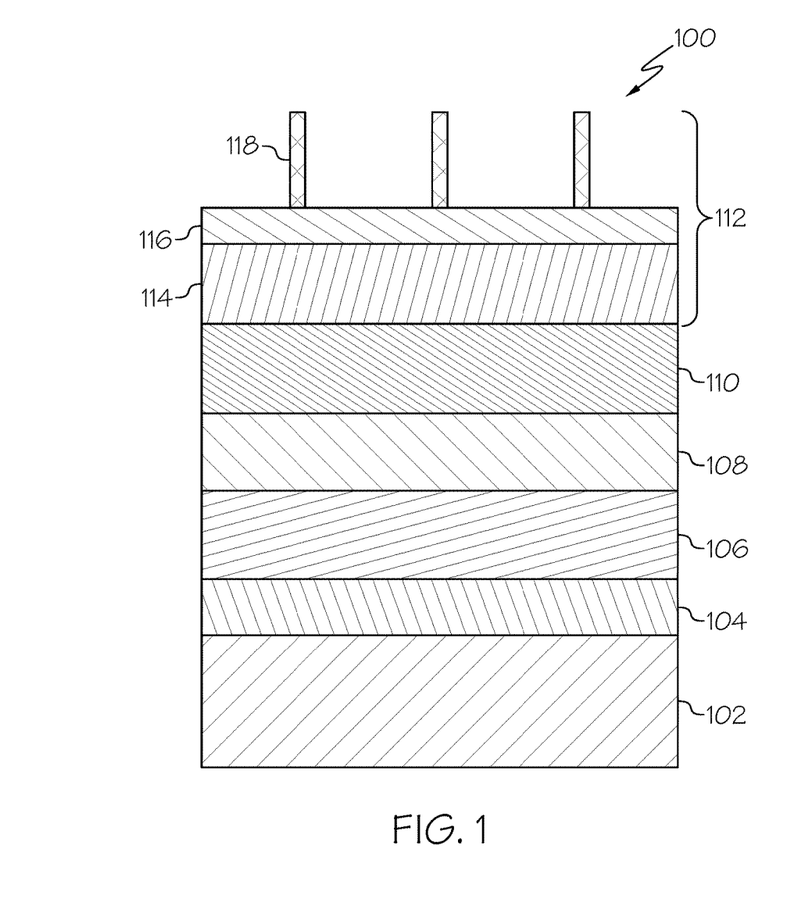
FIG. 1 is a cross-sectional view of an initial semiconductor structure comprising according to one embodiment of the present invention.

Referring now to the drawings in which like numerals represent the same of similar elements, FIGS. 1-18 illustrate various processes for improving fin cut margins using a variable mandrel self-aligned triple patterning process and a selective two color cut. FIG. 1 shows a cross-section of a semiconductor structure 100 at a starting point for embodiments of the present invention. The semiconductor structure 100 of FIG. 1 includes a semiconductor device layer 102, a first hardmask layer 104, a second hardmask layer 106, a sacrificial patterning layer 108, a mandrel layer 110, and a first tri-layer layer stack 112.

In one embodiment, the semiconductor device layer 102 is a bulk semiconductor substrate comprising entirely of a semiconductor material. In other embodiments, the semiconductor device layer 102 is a top semiconductor layer formed on handle substrate (not shown) or a semiconductor-on-insulator (SOI) substrate comprising a handle substrate and an insulator layer. The semiconductor device layer 102, in one embodiment, includes a single crystalline semiconductor material or a polycrystalline material. In another embodiment, the semiconductor device layer 102 includes an elemental semiconductor material such as silicon (Si) or germanium (Ge), a semiconductor material primarily composed of Group IV elements such as a silicon-germanium alloy or a silicon-carbon alloy, a III-V compound semiconductor material, a II-VI compound semiconductor material, an organic semiconductor material.

In yet another embodiment, the semiconductor device layer 102 includes a single crystalline elemental semiconductor material, a single crystalline semiconductor material primarily composed of Group IV elements, a single crystalline III-V compound semiconductor material, a single crystalline II-VI compound semiconductor material, or a single crystalline organic semiconductor material. In a further embodiment, the semiconductor device layer 102 includes undoped single crystalline silicon or single crystalline silicon doped with p-type dopant atoms or n-type dopant atoms. Examples of materials for the semiconductor device layer 102 include, but are not limited to, silicon, germanium, diamond, silicon germanium, silicon carbide, gallium arsenic, indium arsenide, indium phosphide, silicon germanium carbide, gallium arsenic phosphide, gallium indium phosphide, combinations of these, or any other suitable semiconductor material(s) in which fins for multi-gate devices can be formed. In other embodiments, the semiconductor device layer 102 is formed on and in contact with a handle substrate or an insulating layer disposed in contact with a handle substrate. In this embodiment, the handle substrate includes similar materials to those discussed above.

In one embodiment, the first hardmask layer 104 is disposed on and in contact with the semiconductor device layer 102 and includes a masking material(s) such as silicon nitride, titanium nitride, tetraethyl orthosilicate, a combination thereof, and/or the like. The first hardmask layer 104, in one embodiment, is formed using a process such as chemical vapor deposition (CVD), physical vapor deposition (PVD), atomic layer deposition (ALD), a combination thereof, and/or the like. In one embodiment, the first hardmask layer 104 is 20 nm to 60 nm thick, although lesser and greater thicknesses apply. The second hardmask layer 106 is disposed on and in contact with the first hardmask layer 104 and includes a masking material(s) such as an oxide and/or the like. The second hardmask layer 106, in one embodiment, is formed using a process such as CVD, PVD, ALD, a combination thereof, and/or the like. In one embodiment, the second hardmask layer 106 is 30 nm to 70 nm thick, although lesser and greater thicknesses apply The sacrificial patterning layer 108 is disposed on and in contact with the second hardmask layer 106. In one embodiment, the patterning layer 108 is 50 nm to 100 nm thick, although lesser and greater thickness apply. The sacrificial patterning layer 108, in one embodiment, includes amorphous silicon, and is formed using a process such as CVD, PVD, ALD, a combination thereof, and/or the like. In other embodiments, the sacrificial patterning layer 108 is an oxide/nitride, metal containing film, or a carbon-like film.

The mandrel layer 110 is disposed on and in contact with the sacrificial patterning layer 108. In one embodiment, the mandrel layer 110 includes a semiconductor material, a dielectric material, or a conductive material, provided that the material of the mandrel layer 110 is different from at least the sacrificial patterning layer 108. In one embodiment, the mandrel layer 110 includes silicon, a silicon-germanium alloy, germanium, amorphous carbon, silicon oxide, silicon oxynitride, silicon nitride, a dielectric metal oxide, a dielectric metal nitride, a photoresist material, an organic material, an elemental metal, an intermetallic alloy, a metal oxide, a metal nitride, or any other material different from the material of at least the sacrificial patterning layer 108. The mandrel layer 110, in one embodiment, is formed by CVD, PECVD, and/or the like. The thickness of the mandrel layer 110, in one embodiment, is from 50 nm to 300 nm, although lesser and greater thicknesses can also be employed.

The first tri-layer layer stack 112 is disposed on and in contact with the mandrel layer 110. The first tri-layer layer stack 112 includes a bottom layer 114, a middle layer 116, and top photoresist layer 118. The bottom layer 114 is an organic planarization layer (OPL) including a material(s) such as spin-on carbon (SOC), diamond-like carbon, polyarylene ether, polyimide, polymethyl methacrylate, polymethylisopropenyl ketone, photoresists, and/or the like. The organic planarization layer 114, in one embodiment, is formed utilizing any conventional deposition process including, for example, CVD, PVD, plasma enhanced chemical vapor deposition (PECVD), evaporation, spin coating, and dip coating. Chemical mechanical planarization (CMP) and/or grinding can be used to planarize the deposited OPL. In one embodiment, the OPL layer 114 is between 50 nm and 200 nm thick, although lesser and greater thicknesses apply The middle layer 116, in one embodiment, includes an anti-reflective coating (ARC) layer such as a silicon-ARC, titanium-ARC, and/or the like. The ARC layer 116 is formed by, for example, one or more processes including sputtering, evaporation, CVD, PVD, ALD, and/or the like. The top layer 118 is a photoresist layer comprising a material that is sensitive to one or more types of radiation such as extreme ultraviolet (EUV) light, ultraviolet light, electron beam, X-ray, and/or the like. The photoresist material, in one embodiment, is deposited using one or more processes such as CVD, PVD, ALD, and/or the like. In one embodiment, the ARC layer 116 is between 10 nm and 60 nm thick, although lesser and greater thicknesses apply.

FIG. 1 shows the photoresist layer 118 as being patterned. The photoresist layer 118 can be patterned using any suitable photolithography technique. For example, in on embodiment, a photomask (not shown) is disposed over the photoresist layer 118. The photoresist layer 118 is then exposed to a radiation beam, and then hardened via a curing or baking process. Unexposed or exposed portions of the photoresist layer 118 can then be removed using a developer. The foregoing process results in a pattern such as that shown in FIG. 1. The pattern includes portions of the photoresist layer 118 in contact with ARC layer 116 with openings between these portions exposing the ARC layer 116. In some embodiments, the portions of the photoresist layer 118 are trimmed using, for example, an anisotropic plasma etch process.

After the photoresist layer 118 has been patterned, the pattern is transferred to the ARC layer 116 and the OPL layer 114. For example, a selective etching process is used to first transfer the pattern to the ARC layer 116. A separate selective etching process is then used to transfer the pattern to the OPL layer 114. In an alternative embodiment, the ARC layer 116 and the OPL layer 114 are etched using a single etching process. After etching the ARC layer 116 and the OPL layer 114, the photoresist layer 118 and the ARC layer 116 are removed by, for example, a trimming process such as an anisotropic plasma etch. However, in other embodiments, the photoresist layer 118 and the ARC layer 116 are not removed.

Figure 2:
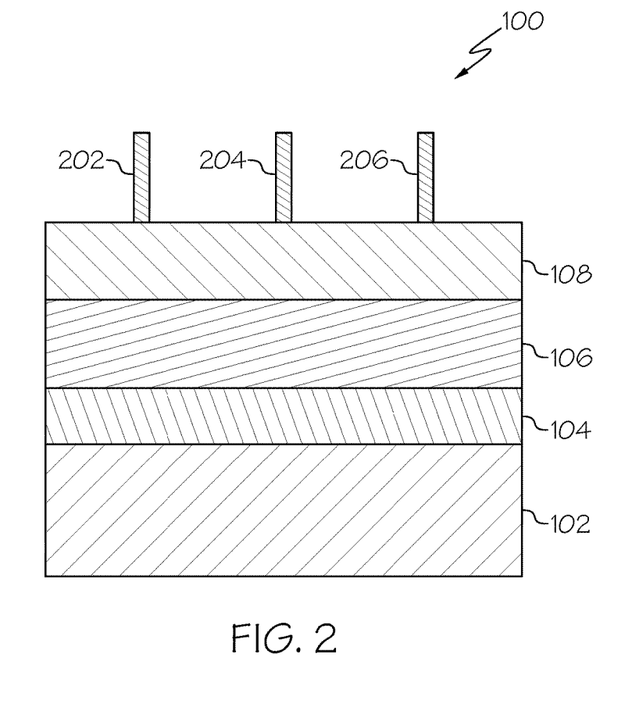
FIG. 2 is a cross-sectional view of the semiconductor structure after mandrel structures have been formed according to one embodiment of the present invention.

The mandrel layer 110 is then etched via a wet etching process, reactive ion etching (RIE), a combination thereof, and/or the like using the OPL layer 114 as a patterning mask to form mandrel structures 202, 204, 206, as shown in FIG. 2. The OPL layer 114 is then removed using one or more plasma etching processes. In embodiments where the photoresist layer 118 and the ARC layer 116 have not been removed, all three layers of the first tri-layer stack 112 are used as a patterning mask to form the mandrels 202, 204, 206. It should be noted that embodiments of the present invention are not limited to the number of mandrels shown in FIG. 2.

In some embodiment, each mandrel 202, 204, 206 that is formed has a rectangular shape in cross-section with a constant width. In one embodiment, the width of each mandrel 202, 204, 206 is from 10 nm to 50 nm, although lesser and greater widths can also be employed. The height of each 202, 204, 206 that is formed is from 50 nm to 300 nm, although lesser and greater height can also be employed. In the embodiment that is illustrated in FIG. 1, the mandrels 202, 204, 206 are arranged parallel to each other to form an array of periodic patterns that is repeated along a direction perpendicular to an elongated direction (i.e., lengthwise direction) of each mandrel 202, 204, 206. In one embodiment, the mandrels 202, 204, 206 have a pitch from 50 nm to 200 nm, although lesser and greater pitch can also be employed. Though the mandrels 202, 204, 206 shown in FIG. 1 have a constant pitch, in some embodiments, the mandrels 202, 204, 206 have a non-constant pitch.

Figure 3:
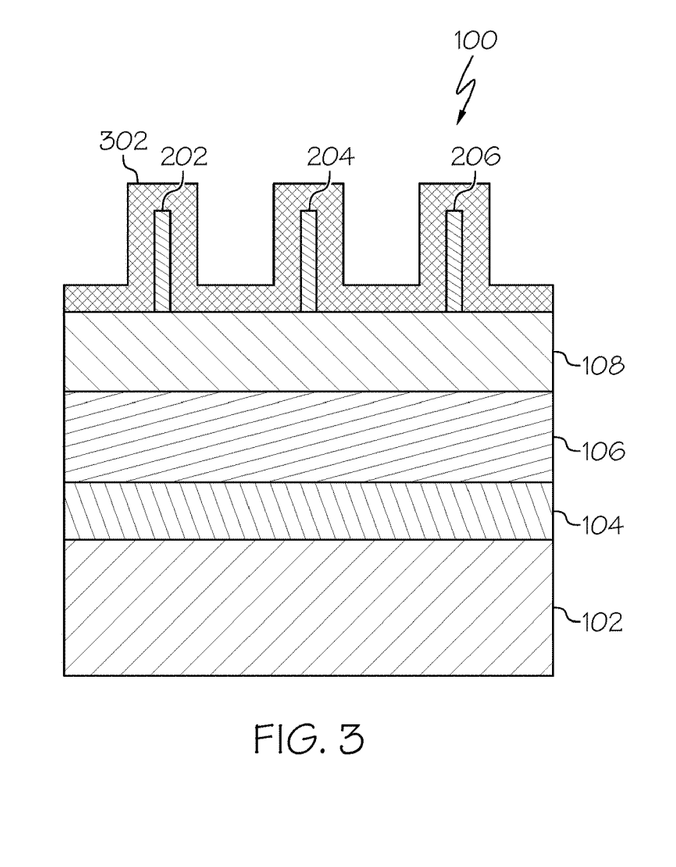
FIG. 3 is a cross-sectional view of the semiconductor structure after a first spacer material has been formed on the mandrel structures according to one embodiment of the present invention.

After the mandrel structures 202, 204, 206 have been formed, a first spacer material 302 is conformally deposited on the top surface of the sacrificial patterning layer 108; the sidewalls of the mandrels 202, 204, 206; and the top surface of the mandrels 202, 204, 206, as shown in FIG. 3. One or more processes such as ALD, CVD, PVD, a combination thereof, and/or the like can be used to deposit the first spacer material 302. In one embodiment, the first spacer material 302 includes a semiconductor material, a dielectric material, or a conductive material, provided that the spacer materials is different from the material of at least the mandrels 202, 204, 206 and the sacrificial patterning layer 108. In one embodiment, the first spacer material 302 includes amorphous carbon, silicon, a silicon-germanium alloy, germanium, silicon oxide, silicon oxynitride, silicon nitride, a dielectric metal oxide, a dielectric metal nitride, an organic material, an elemental metal, an intermetallic alloy, a metal oxide, a metal nitride, or any other material different from the material of at least the mandrels 202, 204, 206 and the sacrificial patterning layer 108. In one embodiment, the first spacer material 302 has an etch selectivity to the mandrels 202, 204, 206 and subsequently formed second spacers. In one example, the mandrels 202, 204, 206 include silicon oxide and the spacer material 302 includes amorphous carbon.

Figure 4:
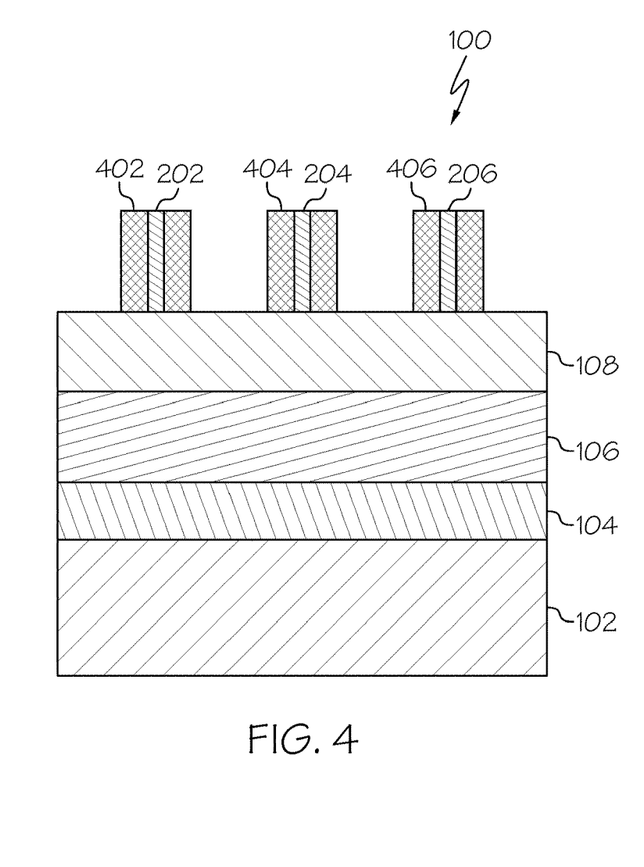
FIG. 4 is a cross-sectional view of the semiconductor structure after first spacers have been formed around the mandrel structures from the first spacer material according to one embodiment of the present invention.
Figure 5:
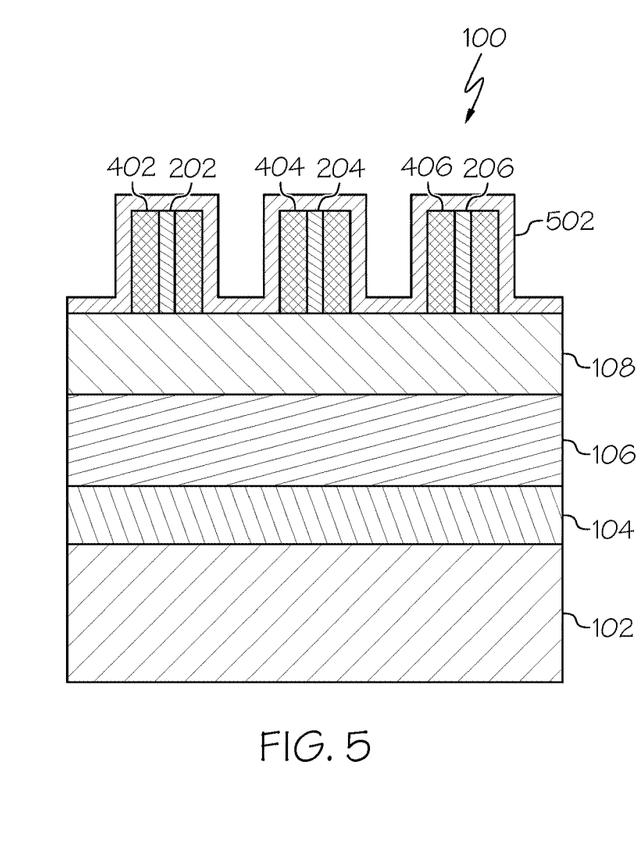
FIG. 5 is a cross-sectional view of the semiconductor structure after a second spacer material has been formed on the mandrel structures according to one embodiment of the present invention.

After the first spacer material 302 has been deposited, the material 302 is etched using, for example, an anisotropic etch such as RIE to form spacers 402, 404, 406 around each mandrel 202, 204, 206. For example, FIG. 4 shows that the horizontal portions of the first spacer material 302 have been removed to form the spacers 402, 404, 406 around the mandrels 202, 204, 206. A second spacer material 402 is then deposited on the top surface of the sacrificial patterning layer 108; the sidewalls of first spacers 402, 404, 406; the top surface of the first spacers 402, 404, 406; and the top surface of the mandrels 202, 204, 206, as shown in FIG. 5. One or more processes such as ALD, CVD, PVD, a combination thereof, and/or the like can be used to deposit the second spacer material 502. The thickness of the second spacer material 502, in one embodiment, varies depending upon the desired width of final semiconductor fins structures to be formed in semiconductor device layer 102, and can be from 5 nm to 15 nm, although lesser and greater thicknesses can also be employed.

In one embodiment, the second spacer material 502 includes a semiconductor material, a dielectric material, or a conductive material, provided that the spacer materials is different from the material of at least the first spacers 402, 404, 406; the mandrels 202, 204, 206; and the sacrificial patterning layer 108. In one embodiment, the second spacer material 502 includes silicon nitride, silicon, a silicon-germanium alloy, germanium, silicon oxide, silicon oxynitride, amorphous carbon, a dielectric metal oxide, a dielectric metal nitride, an organic material, an elemental metal, an intermetallic alloy, a metal oxide, a metal nitride, or any other material different from the material of at least the first spacers 402, 404, 406; the mandrels 202, 204, 206; and the sacrificial patterning layer 108. In one embodiment, the second spacer material 502 has an etch selectivity to the mandrels 202, 204, 206 and the first spacers 402, 404, 406. In one example, the mandrels 202, 204, 206 include silicon oxide, the first spacers 402, 404, 406 includes amorphous carbon, and the second spacer material 502 includes silicon nitride.

Figure 6:
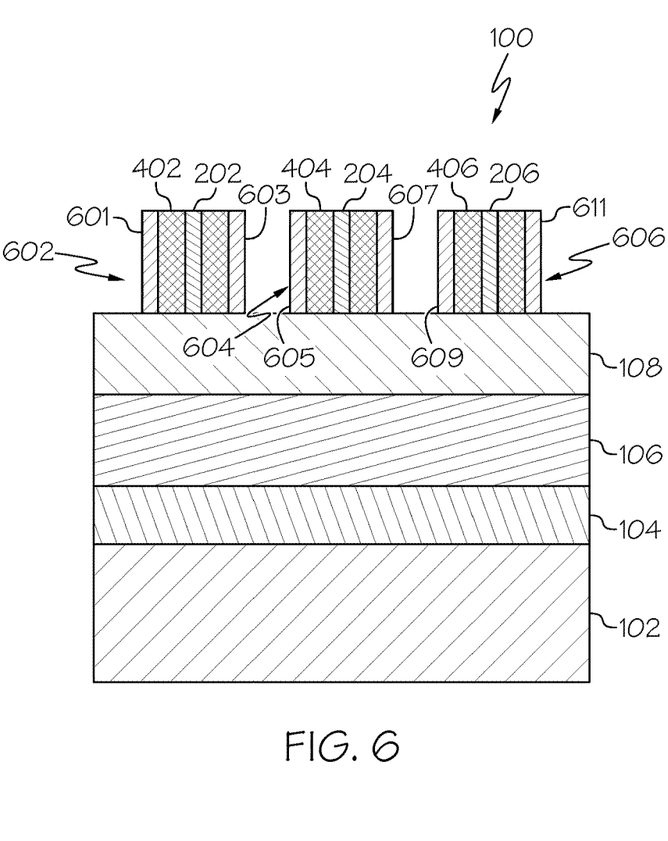
FIG. 6 is a cross-sectional view of the semiconductor structure after second spacers have been formed around the first spacers from the second spacer material according to one embodiment of the present invention.

After the second spacer material 502 has been deposited, the material 502 is etched using, for example, an anisotropic etch such as RIE to form second spacers 602, 604, 606 around each of the first spacers 402, 404, 406. For example, FIG. 6 shows that the horizontal portions of the second spacer material 502 have been removed to form a second spacer 602, 604, 606 around the first spacers 402, 404, 406. Each of the second spacers 602, 604, 606 includes sidewalls 601, 603, 605, 607, 609, 611 surrounding the first spacers 402, 404, 406.

Figure 7:
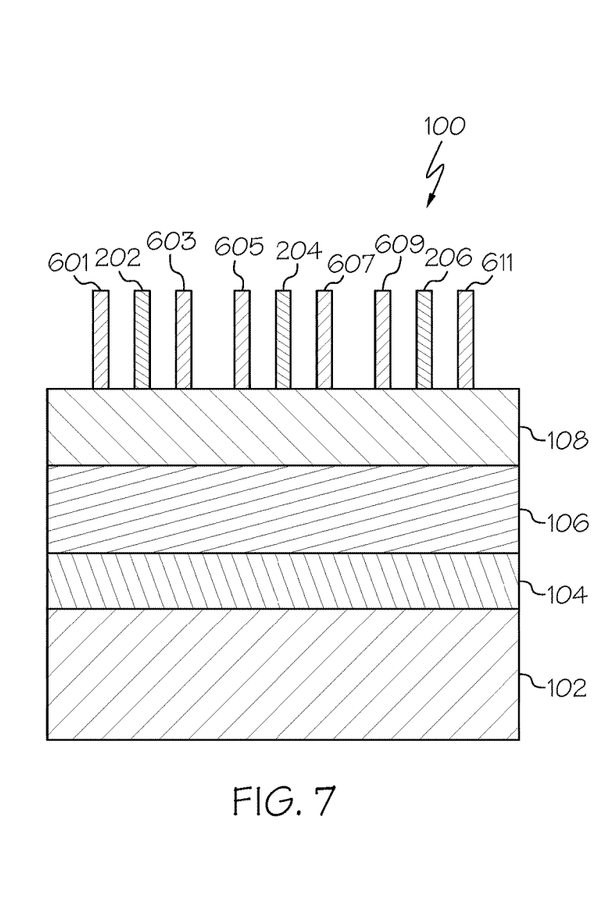
FIG. 7 is a cross-sectional view of the semiconductor structure after the first spacers have been removed according to one embodiment of the present invention.
Figure 8:
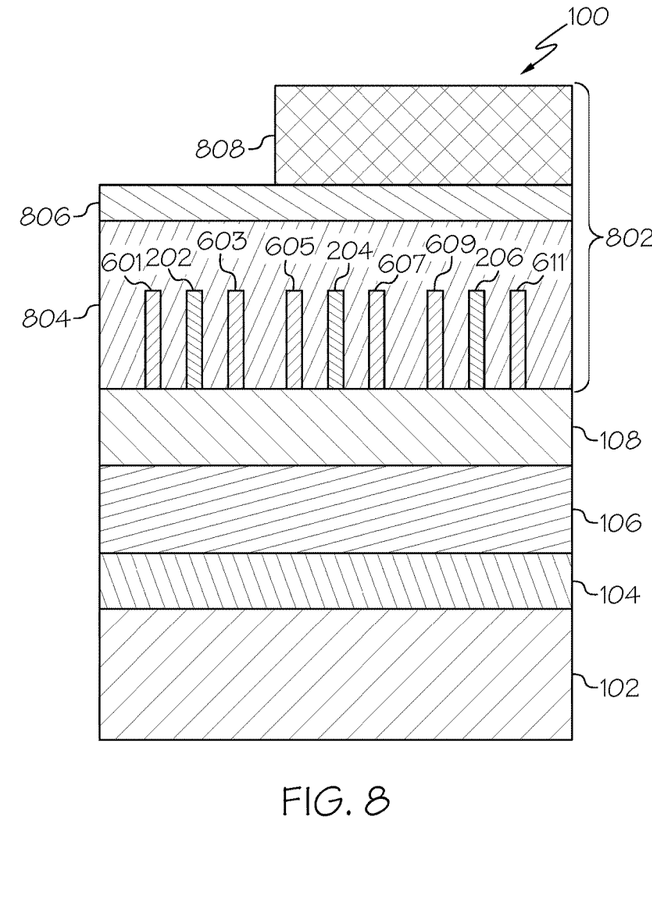
FIG. 8 is a cross-sectional view of the semiconductor structure after a tri-layer stack has been formed over the mandrel structures and second spacers according to one embodiment of the present invention.

The first spacers 402, 404, 406 are then removed selective to the mandrels 204, 206, 206 and the second spacers 602, 604, 606, as shown in FIG. 6. In one embodiment, an etching process such as an isotropic etch or an anisotropic etch is used to selectively remove the first spacers 402, 404, 406. A second tri-layer stack 802 is then formed over and in contact with the sacrificial patterning layer 108; the mandrels 202, 204, 206; and the second spacers 602, 604, 606, as shown in FIG. 7. The second tri-layer stack 802 is similar to the tri-layer stack of FIG. 1 and comprises an OPL layer 804, an ARC layer 806, and a photoresist layer 808. The photoresist layer 808 is patterned such that only some of the mandrels 204, 206 and second spacers 604, 606 are blocked by the photoresist layer 808, while one or more of the mandrels 202 and second spacers 602 are not blocked by the photoresist layer 808. In one embodiment, the photoresist layer 808 is patterned using a lithographic process similar to that discussed above with respect to FIG. 1.

Figure 9:
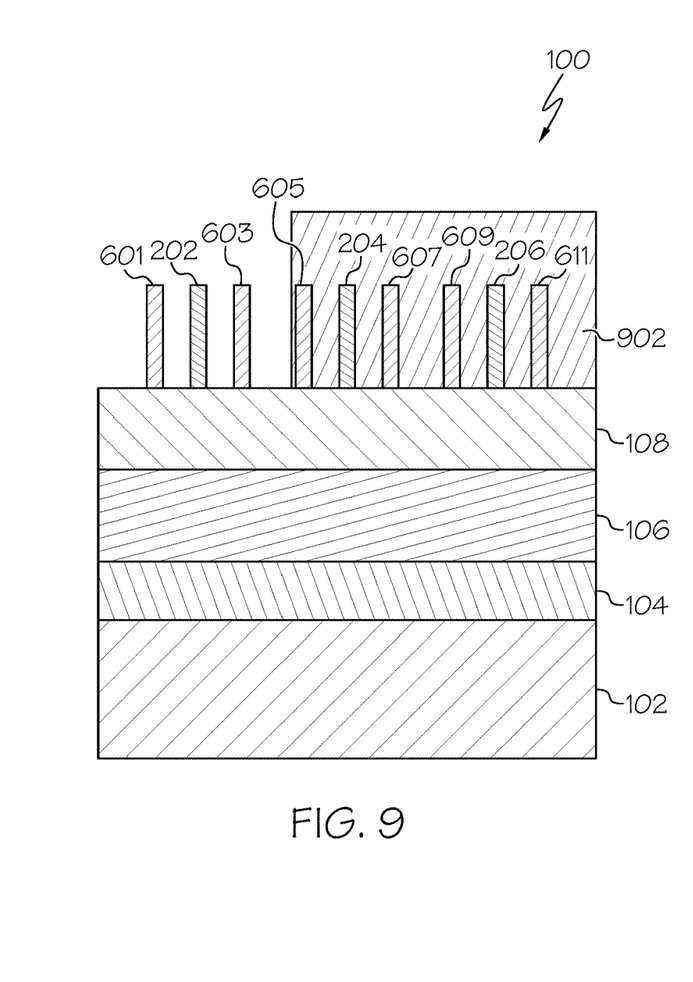
FIG. 9 is a cross-sectional view of the semiconductor structure after the tri-layer stack has been patterned to form a cut mask exposing one or more mandrel structures and one or more second spacers according to one embodiment of the present invention.

After the photoresist layer 808 has been patterned, the pattern is transferred to the ARC layer 804 and the OPL layer 804. For example, a selective etching process is used to first transfer the pattern to the ARC layer 804. A separate selective etching process is then used to transfer the pattern to the OPL layer 804. In an alternative embodiment, the ARC layer 806 and the OPL layer 804 are etched using a single etching process. After etching the ARC layer 806 and the OPL layer 804, the photoresist layer 808 and the ARC layer 804 are removed by, for example, a trimming process such as an anisotropic plasma etch. The result of this process is a patterned OPL layer 902, as shown in FIG. 9. This layer 902 acts as a mandrel cut mask in subsequent processing steps. The patterned OPL layer 902 only covers some of the mandrels 204, 206 and sidewalls 605, 607, 609, 611 of some of the second spacers 604, 606 while one or more of the mandrels 202, sidewalls 601, 603 of one or more of the second spacers 602, and a portion of the sacrificial patterning layer 108 are left exposed.

Figure 14:
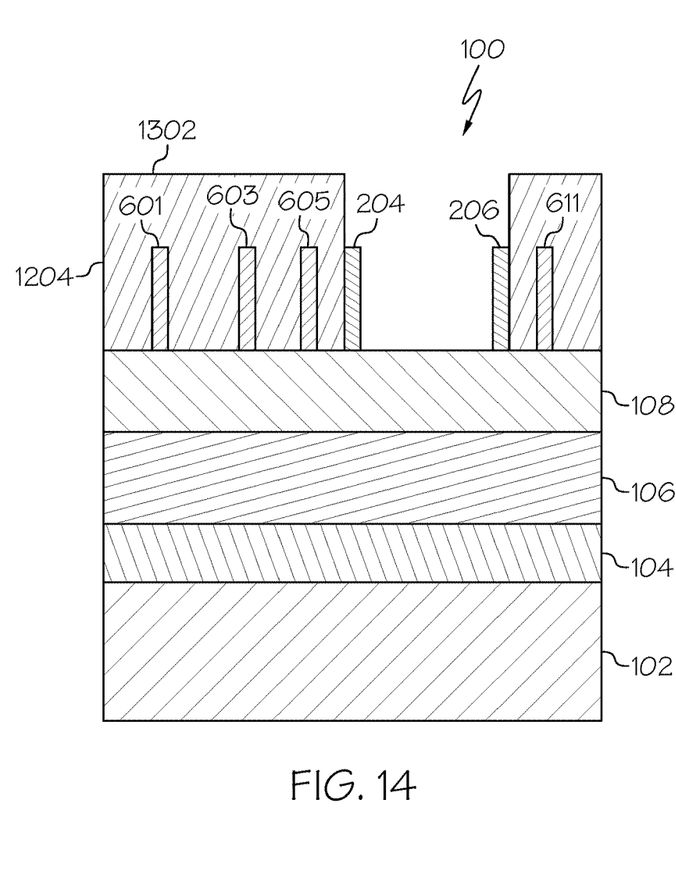
FIG. 14 is a cross-sectional view of the semiconductor structure after the one or more exposed second spacers have been removed according to one embodiment of the present invention.

One advantage of using materials with different etch selectivities for the mandrels 202, 204, 206 and spacers 602, 604, 606 is that the margin for landing the cut mask is increased. For example, if the mandrels 202, 204, 206 and spacers 602, 604, 606 comprise the same material and the pitch between these features is 20 nm there would be a 10 nm margin to land the but mask between the feature to be removed and its adjacent features. By using, using materials with different etch selectivities for the mandrels 202, 204, 206 and spacers 602, 604, 606 the margin for landing the cut mask is increased as shown in FIG. 14. For example, the cut mask 902 in FIG. 14 is able to land anywhere between mandrel 204 and the mandrel 202 to be removed. Any spacer sidewalls 601, 603, 605 between and/or adjacent to these mandrels 202, 204 can be left exposed due to their selectivity with respect to the mandrels.

Figure 10:
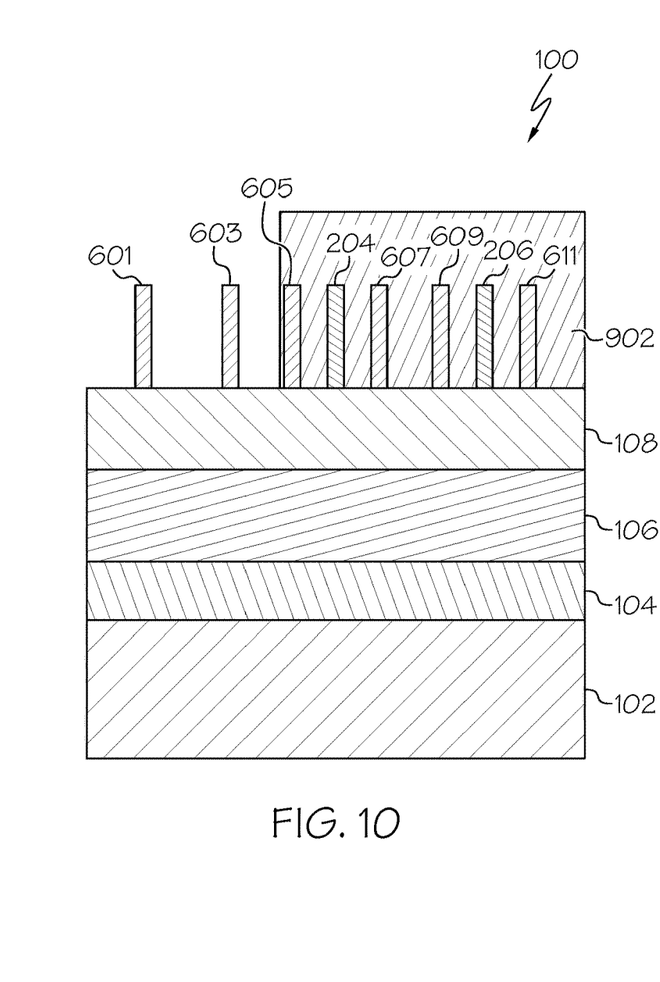
FIG. 10 is a cross-sectional view of the semiconductor structure after the one or more exposed mandrel structures have been removed according to one embodiment of the present invention.
Figure 11:
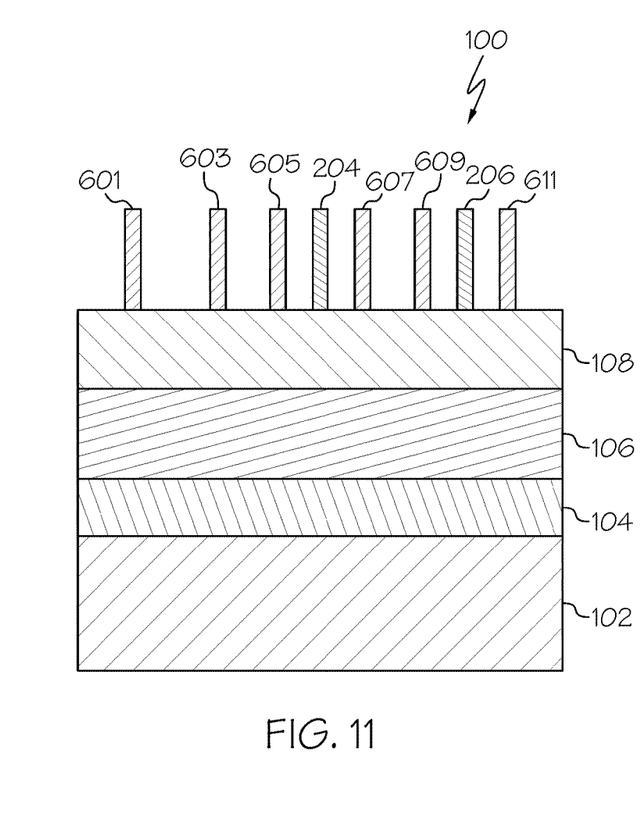
FIG. 11 is a cross-sectional view of the semiconductor structure after the cut mask has been removed according to one embodiment of the present invention.

Referring now to FIG. 10, any exposed mandrels 202 are then cut using a selective etching process. For example, an etching process such as an isotropic etch or an anisotropic etch is used to remove exposed mandrels 202 selective to the exposed second spacers 602 and the cutting mask 902. It should be noted that embodiments of the present invention are not limited to the number of mandrels removed in FIG. 10. The cutting mask 902 is then removed, as shown in FIG. 11. In one embodiment, the cutting mask 902 is removed using one or more plasma etching processes. As shown in FIG. 11, removing at least one mandrel 202 from between its surrounding one pair of spacer sidewalls 601, 603 creates a pitch between the pair of spacer sidewalls 601, 603 different from the pitch between the other pairs of spacer sidewalls and between mandrel-sidewall pairs.

Figure 12:
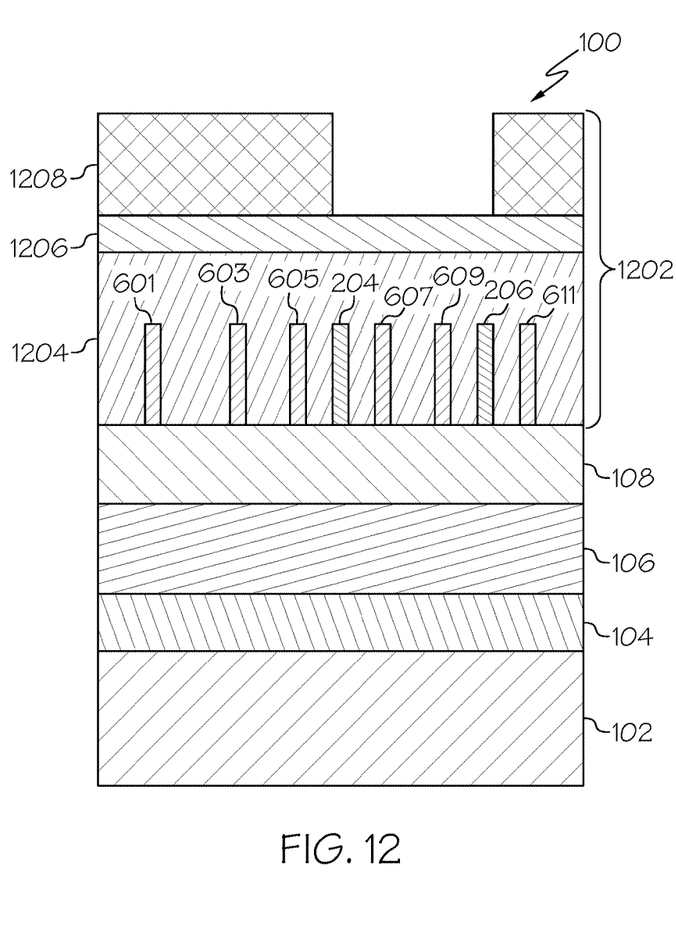
FIG. 12 is a cross-sectional view of the semiconductor structure after another tri-layer stack has been formed over the remaining mandrel structures and second spacers according to one embodiment of the present invention.

A third tri-layer stack 1202 is then formed over and in contact with the sacrificial patterning layer 108; the remaining mandrels 204, 206; and the sidewalls 601 to 611 of the second spacers 602, 604, 606, as shown in FIG. 12. The third tri-layer stack 1202 is similar to the tri-layer stacks of FIG. 1 and FIG. 8, and comprises an OPL layer 1204, an ARC layer 1206, and a photoresist layer 1208. The photoresist layer 1208 is patterned such that one or more sidewalls 601, 603, 605, 611 of at least one of the second spacers 602, 606 are blocked by the photoresist layer 1208, while one or more of the remaining mandrels 204, 206 and one or more sidewalls 607, 609 of at least one of the second spacers 604, 606 are not blocked by the photoresist layer 1208. In one embodiment, the photoresist layer 1208 is patterned using a process similar to that discussed above with respect to FIG. 1.

Figure 13:
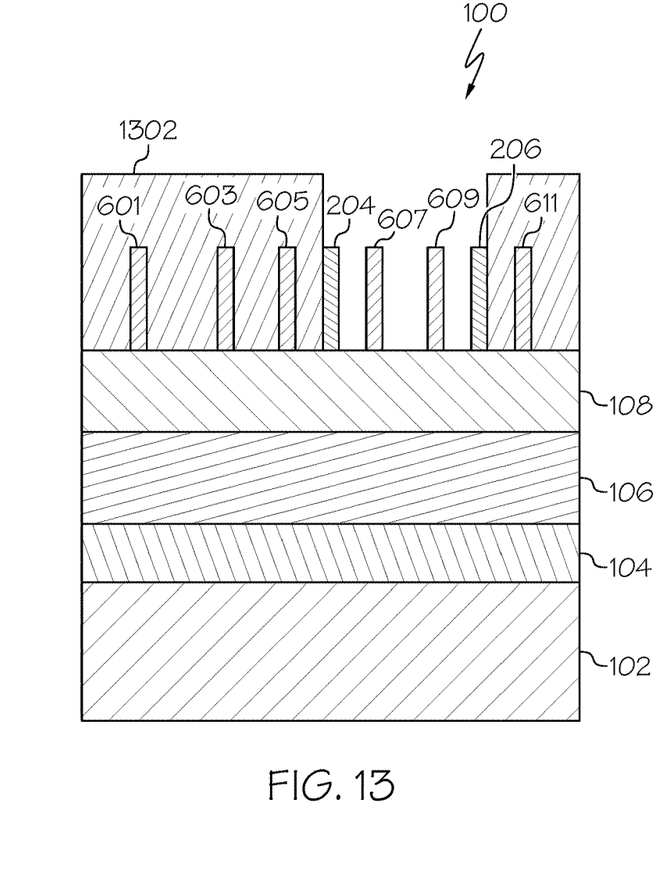
FIG. 13 is a cross-sectional view of the semiconductor structure after the tri-layer stack has been patterned to form a cut mask exposing one or more mandrel structures and one or more second spacers according to one embodiment of the present invention.

After the photoresist layer 1208 has been patterned, the pattern is transferred to the ARC layer 1204 and the OPL layer 1204, similar to that discussed above with respect to FIGS. 1 and 8. After etching the ARC layer 1206 and the OPL layer 1204, the photoresist layer 1208 and the ARC layer 1204 are removed by, for example, a trimming process such as an anisotropic plasma etch. The result of this process is a patterned OPL layer 1302, as shown in FIG. 13. This layer 1302 acts as a spacer cut mask in subsequent processing steps. The patterned OPL layer 1302 only covers one or more sidewalls 601, 603, 605, 611 of at least one of the second spacers 602, 606 while one or more of the remaining mandrels 204, 206; one or more sidewalls 607, 609 of at least one of the second spacers 604, 606, and a portion of the sacrificial patterning layer 108 are left exposed. Similar to the advantage discussed above with respect to FIG. 9, FIG. 13 shows that the margin for landing the cut mask 1302 has been increased such that a much wider area can be exposed than if the mandrels and sidewall spacers comprised the same materials.

Figure 15:
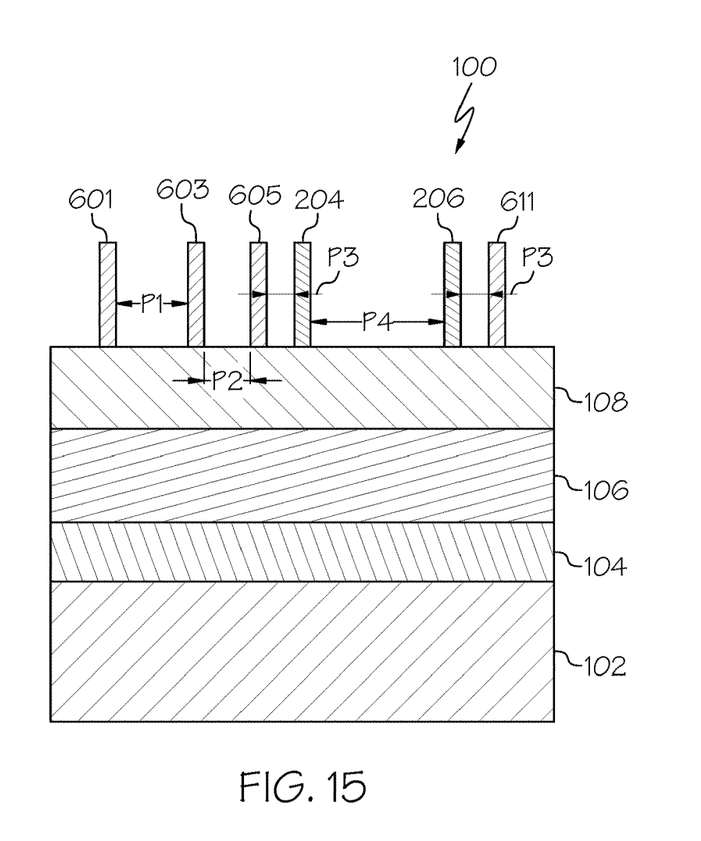
FIG. 15 is a cross-sectional view of the semiconductor structure after the cut mask has been removed according to one embodiment of the present invention.

Any exposed spacer sidewalls 607, 609 are then cut using a selective etching process, as shown in FIG. 14. For example, an etching process such as an isotropic etch or an anisotropic etch is used to remove exposed spacer sidewalls 907, 609 selective to exposed mandrels 204, 206 and the cutting mask 1302. It should be noted that embodiments of the present invention are not limited to the number of spacer sidewalls removed in FIG. 14. The cutting mask 1302 is then removed, as shown in FIG. 15. In one embodiment, the cutting mask 1302 is removed using one or more plasma etching processes.

The remaining mandrels 204, 206 and remaining spacer sidewalls 601, 603, 605, 611 act as hardmasks for subsequent patterning of the sacrificial layer 108. The cutting process discussed above form multiple pitches between different sets of the hardmasks. For example, a first pitch P1 exists between the spacer sidewalls 601 and 603; a second pitch P2 exists between spacer sidewalls 603 and 605; a third pitch P3 exists between spacer sidewall 605 and mandrel 204, and mandrel 206 and spacer sidewall 611; and a fourth pitch P4 exists between mandrels 204 and 206. As noted above, these varying pitches are possible because of forming the mandrels 202, 204, 206 and the second spacers 602, 604, 606 with different materials that are selective to one another. It should be noted that embodiments of the present invention are not limited to the number of different pitches shown in FIG. 15.

In one embodiment, an additional tri-layer stack (not shown) is formed over and in contact with a portion of sacrificial patterning layer 108 and a portion of the spacer sidewalls 601, 603, 605 and mandrels 204, 206 that are to be used as hardmasks for a subsequent feature patterning process. The tri-layer stack 1202 is similar to the tri-layer stack of FIGS. 1, 8, and 12. One or more etching processes are then performed to remove exposed portions of the spacer sidewalls 601, 603, 605 and mandrels 204, 206 that are not to be used as hardmasks for the subsequent feature patterning process. Any remaining layers of the tri-layer stack are removed using, for example, one or more plasma etching processes.

Figure 16:
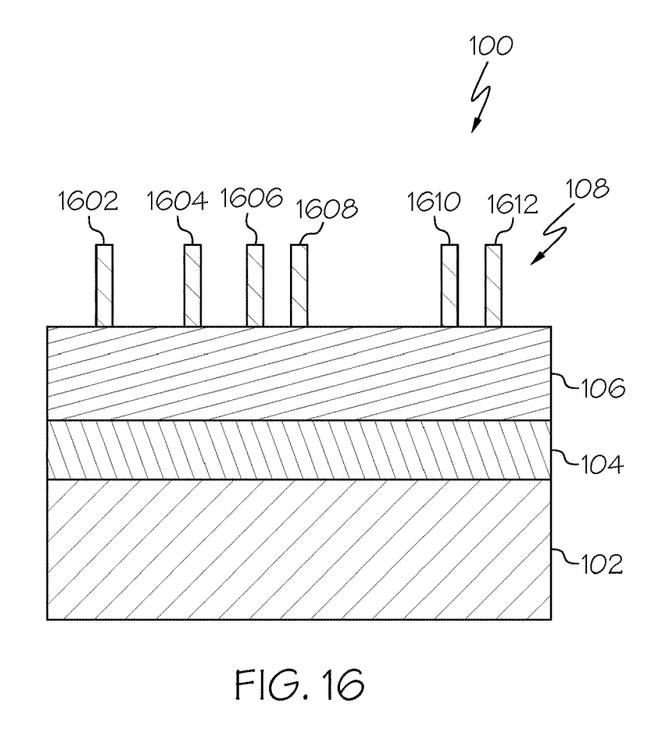
FIG. 16 is a cross-sectional view of the semiconductor structure after a sacrificial patterning layer has been patterned into features using the remaining mandrel structures and second spacers as etch masks according to one embodiment of the present invention.

The sacrificial patterning layer 108 is then patterned using one or more etching processes such as an anisotropic etch that stops on the second hardmask layer 106, as shown in FIG. 16. For example, the sacrificial patterning layer 108 is patterned employing the spacer sidewalls 601, 603, 605 and mandrels 204, 206 as an etch mask. Thus, the etching process transfers the pattern of the spacer sidewalls 601, 603, 605 and mandrels 204, 206 to the sacrificial patterning layer 108 to form corresponding patterned portions 1602 to 1612.

Figure 17:
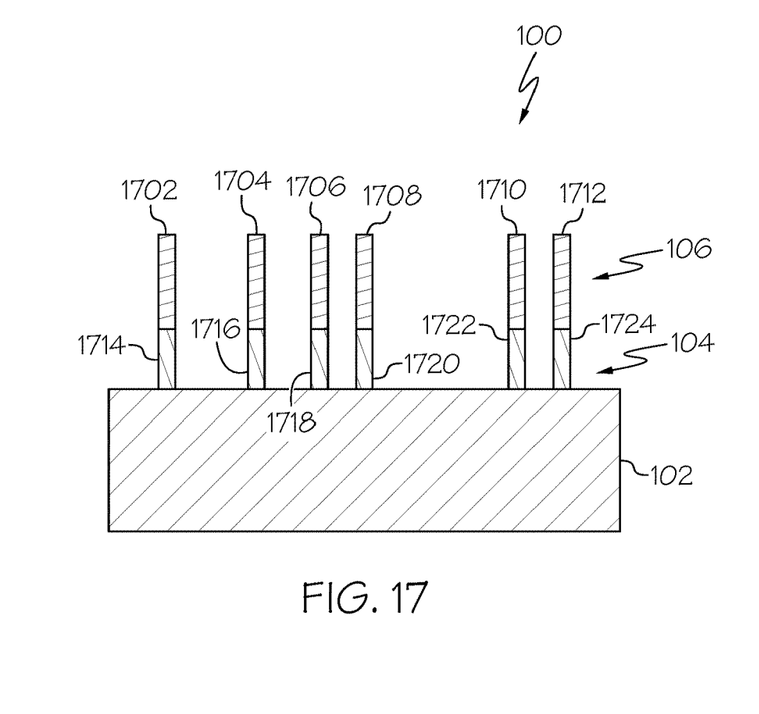
FIG. 17 is a cross-sectional view of the semiconductor structure after first and second hardmask layers have been patterned using the sacrificial patterning layer features as etch masks according to one embodiment of the present invention.

The first and second hardmask layers 104, 106 are then patterned using one or more etching processes such as an anisotropic etch that stops on the semiconductor device layer 102, as shown in FIG. 17. For example, the first and second hardmask layers 104, 106 are patterned employing the sacrificial patterning layer features 1602 to 1612 as an etch mask. Thus, the etching process transfers the pattern of the sacrificial patterning layer features 1602 to 1612 to the first and second hardmask layers 104, 106 form corresponding second hardmask layer features 1702 to 1712 and corresponding first hardmask layer features 1714 to 1724. The sacrificial patterning layer features 1602 to 1612 are then removed.

Figure 18:
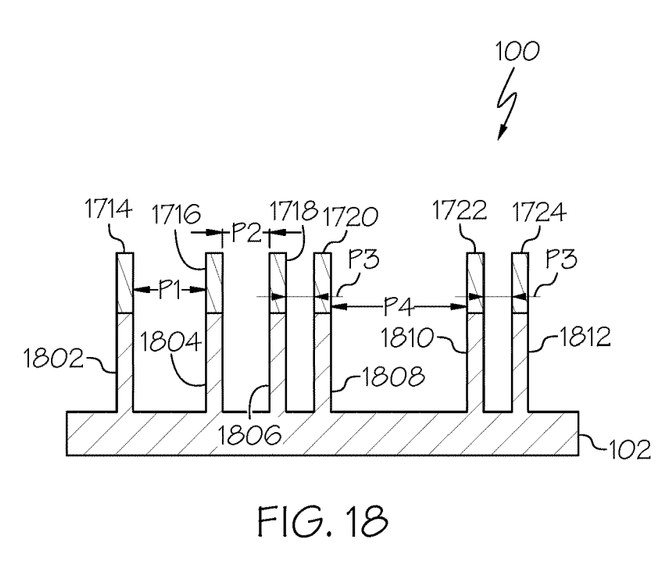
FIG. 18 is a cross-sectional view of the semiconductor structure semiconductor fins have been formed in a semiconductor layer using the patterned first and second hardmask layers as masks according to one embodiment of the present invention.

The semiconductor device layer 102 is then patterned using the second hardmask layer features 1702 to 1712 and corresponding first hardmask layer features 1714 to 1724 as an etch mask, as shown in FIG. 18. The semiconductor device layer 102, in one embodiment, is performed utilizing an anisotropic etching process. This process forms a plurality of semiconductor fins 1802 to 1812 within the semiconductor device layer 102. A subsequent etching process is performed to remove the second hardmask layers 1702 to 1712. Each of the semiconductor fins 1802 to 1812 comprises a width corresponding to corresponding first and second hardmask layer feature used as an etch mask. FIG. 18 further shows that different pairs of fins have different pitches. For example, a first pitch P1 exists between fins 1802 and 1804; a second pitch P2 exists between fins 1804 and 1806; a third pitch P3 exists between fins 1806 and 1808, and fins 1810 and 1812; and a fourth pitch P4 exists between fins 1808 and 1810. It should be noted that embodiments of the present invention are not limited to the number of different pitches shown in FIG. 18.

As used herein, a "semiconductor fin" refers to a semiconductor structure including a portion having a shape of a rectangular parallelepiped. The direction along which a semiconductor fin laterally extends the most is herein referred to as a "lengthwise direction" of the semiconductor fin. The height of each semiconductor fin 1802 to 1812, in one embodiment, ranges from 5 nm to 300 nm, although lesser and greater heights can also be employed. The width of each semiconductor fin 1802 to 1812, in one embodiment, ranges from 5 nm to 50 nm, although lesser and greater widths can also be employed. Multiple semiconductor fins can be arranged such that each semiconductor fin has the same lengthwise direction, and is laterally spaced from each other along a horizontal direction that is perpendicular to the lengthwise direction. In this case, the horizontal direction that is perpendicular to the common lengthwise direction is referred to as a "widthwise direction". each semiconductor fin 1802 to 1812 includes a pair of parallel sidewalls along the lengthwise direction and a pair of parallel sidewalls along the widthwise direction and at each end segment of the semiconductor fin.

At this point in the fabrication process, a functional gate structure utilizing a gate first or a gate last process can be performed to provide finFET structures. It is noted that while the above describes a method of forming semiconductor fins from a semiconductor substrate, the method of the present invention can be applied to pattern any other type substrate.

Figure 19:
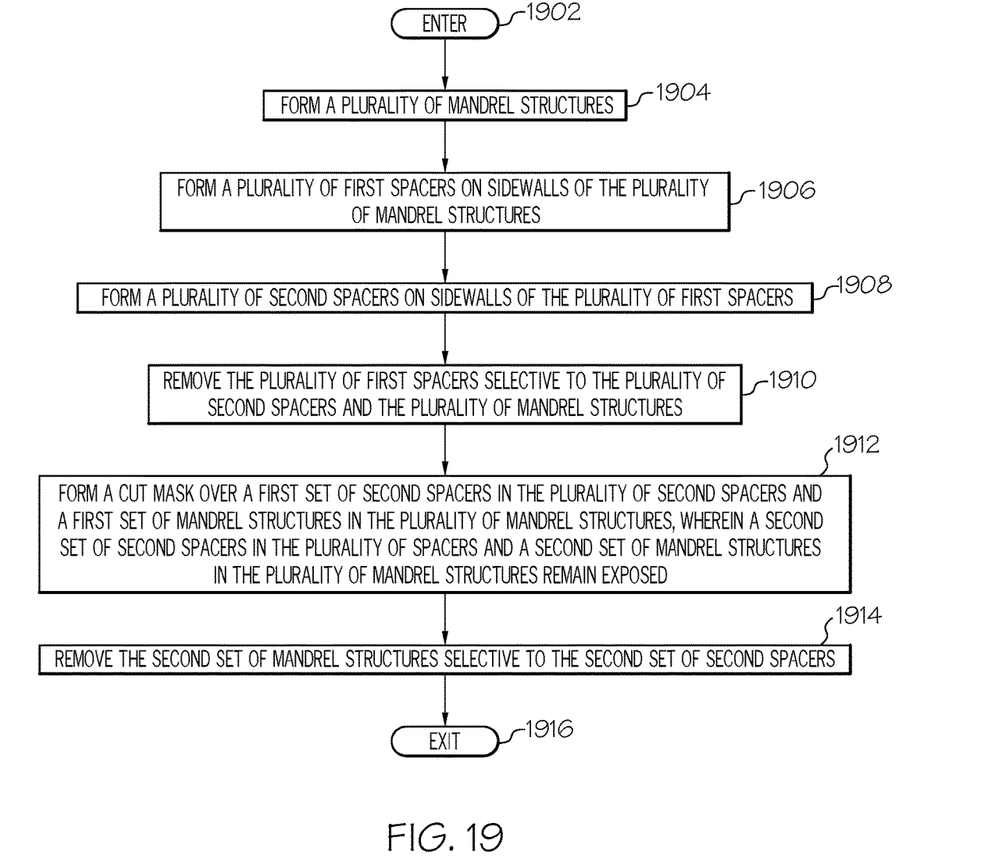
FIG. 19 is an operational flow diagram illustrating one process for fabricating a semiconductor structure according to one embodiment of the present invention.

FIG. 19 is an operational flow diagram illustrating one process for fabricating a semiconductor structure. It should be noted that each of the steps shown in FIG. 19 has been discussed in greater detail above with respect to FIGS. 1-18. In FIG. 19, the operational flow diagram begins at step 1902 and flows directly to step 1904. A plurality of mandrels is formed, at step 1904. A plurality of first spacers is formed on sidewalls of the plurality of mandrel structures, at step 1906. A plurality of second spacers is formed on sidewalls of the plurality of first spacers, at step 1908. The plurality of first spacers is removed selective to the plurality of second spacers and the plurality of mandrel structures, at step 1910. A cut mask is formed over a first set of second spacers in the plurality of second spacers and a first set of mandrel structures in the plurality of mandrel structures, at step 1912. A second set of second spacers in the plurality of spacers and a second set of mandrel structures in the plurality of mandrel structures remain exposed. The second set of mandrel structures is removed selective to the second set of second spacers, at step 1914. The control flow exits at step 1916.

Although specific embodiments of the invention have been disclosed, those having ordinary skill in the art will understand that changes can be made to the specific embodiments without departing from the spirit and scope of the invention. The scope of the invention is not to be restricted to the specific embodiments, and it is intended that the appended claims cover any and all such applications, modifications, and embodiments within the scope of the present invention.

It should be noted that some features of the present invention may be used in one embodiment thereof without use of other features of the present invention. As such, the foregoing description should be considered as merely illustrative of the principles, teachings, examples, and exemplary embodiments of the present invention, and not a limitation thereof.

Also, these embodiments are only examples of the many advantageous uses of the innovative teachings herein. In general, statements made in the specification of the present application do not necessarily limit any of the various claimed inventions. Moreover, some statements may apply to some inventive features but not to others.

What is claimed is:

1. A method of forming a semiconductor structure comprising:
   forming a plurality of mandrel structures;
   forming a plurality of first spacers on sidewalls of the plurality of mandrel structures;
   forming a plurality of second spacers on sidewalls of the plurality of first spacers; and
   removing the plurality of first spacers selective to the plurality of second spacers and the plurality of mandrel structures.

2. The method of claim 1, wherein removing the plurality of first spacers disposes each mandrel of the plurality of mandrel structures between a pair of second spacers of the plurality of second spacers.

3. The method of claim 1, wherein each second spacer of the plurality of second spacers comprises a material different from a material of each mandrel structure of the plurality of mandrel structures.

4. The method of claim 1, wherein forming the plurality of mandrel structures comprises:
   forming a planarization layer on and in contact with a mandrel layer;
   forming an anti-reflective coating on and in contact with the planarization layer;
   forming a photoresist layer on and in contact with the anti-reflective coating;
   patterning the photoresist layer; and
   transferring the pattern to the mandrel layer, wherein the transferring forms the plurality of mandrel structures.

5. The method of claim 1, wherein the plurality of first spacers comprises amorphous carbon.

6. The method of claim 1, wherein the plurality of second spacers comprises a nitride material.

7. The method of claim 1, wherein the plurality of mandrel structures comprises an oxide material.

8. The method of claim 1, further comprising:
   forming a mask over a subset of the plurality of second spacers and a subset of the plurality of mandrel structures; and
   removing exposed mandrels of the plurality of mandrels selective to exposed second spacers of the plurality of second spacers.

9. The method of claim 8, further comprising removing the cut mask selective to the first set of second spacers and the first set of mandrel structures.

10. The method of claim 9, further comprising:
    forming another cut mask over one or more second spacers of the plurality of second spacers, wherein one or more second spacers of the plurality of second spacers and one or more mandrel structures of the plurality of mandrel structures remain exposed; and
    removing the one or more second spacers selective to the one or more mandrel structures.

11. The method of claim 10, further comprising:
    patterning a substrate utilizing one or more remaining second spacers of the plurality of second spacers and one or more remaining mandrel structures of the plurality of mandrel structures as initial etch masks.

12. The method of claim 11, wherein the patterning forms a plurality of fin structures from the substrate, and wherein a first set of fin structures of the plurality of fin structures comprises a first pitch different from at least a second pitch of at least a second set of fin structures of the plurality of fin structures.

13. The method of claim 11, wherein patterning the substrate comprises at least:
    patterning a sacrificial layer utilizing the one or more remaining second spacers and the one or more remaining mandrel structures, and wherein the patterning forms a plurality of sacrificial layer features corresponding to the one or more remaining second spacers and the one or more remaining mandrel structures;
    patterning a first hardmask layer and a second hardmask layer utilizing the plurality of sacrificial layer features as etch masks, and wherein the patterning forms a plurality of features each comprising a portion of the first hardmask layer and the second hardmask layer; and
    patterning the substrate utilizing the plurality of features as an etch mask to form the plurality of features.

14. A method of forming a semiconductor structure comprising:
    forming a first hardmask layer on and in contact with a substrate;

forming a second hardmask layer on and in contact with the first hardmask layer;

forming a sacrificial patterning layer on and in contact with the second hardmask layer;

forming a plurality of mandrel structures on and in contact with the sacrificial patterning layer;

forming a plurality of first spacers on sidewalls of the plurality of mandrel structures;

forming a plurality of second spacers on sidewalls of the plurality of first spacers; and removing the plurality of first spacers selective to the plurality of second spacers and the plurality of mandrel structures.

15. The method of claim 14, wherein each second spacer of the plurality of second spacers comprises a material different from a material of each mandrel structure of the plurality of mandrel structures.

16. The method of claim 14, further comprising:
   forming a mask over a subset of the plurality of second spacers and a subset of the plurality of mandrel structures; and
   removing exposed mandrels of the plurality of mandrels selective to exposed second spacers of the plurality of second spacers.

17. The method of claim 16, further comprising:
   forming another cut mask over one or more second spacers of the plurality of second spacers, wherein one or more second spacers of the plurality of second spacers and one or more mandrel structures of the plurality of mandrel structures remain exposed; and
   removing the one or more second spacers selective to the one or more mandrel structures.

18. The method of claim 17, further comprising:
   patterning a substrate utilizing one or more remaining second spacers of the plurality of second spacers and one or more remaining mandrel structures of the plurality of mandrel structures as initial etch masks.

19. The method of claim 18, wherein the patterning forms a plurality of fin structures from the substrate, and wherein a first set of fin structures of the plurality of fin structures comprises a first pitch different from at least a second pitch of at least a second set of fin structures of the plurality of fin structures.

20. A method of forming a semiconductor structure comprising:
   forming a plurality of mandrel structures over a substrate;
   forming a plurality of first spacers on sidewalls of the plurality of mandrel structures;
   forming a plurality of second spacers on sidewalls of the plurality of first spacers;
   removing the plurality of first spacers selective to the plurality of second spacers and the plurality of mandrel structures; and
   patterning the substrate utilizing one or more of the second spacers of the plurality of second spacers and one or more of the mandrel structures of the plurality of mandrel structures, wherein the patterning forms a plurality of fin structures from the substrate.

* * * * *